United States Patent
Vekris et al.

(10) Patent No.: US 6,331,477 B1
(45) Date of Patent: Dec. 18, 2001

(54) DOPING OF SPHERICAL SEMICONDUCTORS DURING NON-CONTACT PROCESSING IN THE LIQUID STATE

(75) Inventors: Evangellos Vekris; Nainesh J. Patel; Murali Hanabe, all of Plano, TX (US)

(73) Assignee: Ball Semiconductor, Inc., Allen, TX (US)

( * ) Notice: Subject to any disclaimer, the term of this patent is extended or adjusted under 35 U.S.C. 154(b) by 0 days.

(21) Appl. No.: 09/489,782

(22) Filed: Jan. 24, 2000

(51) Int. Cl.⁷ .................................................. H01L 21/22
(52) U.S. Cl. ............................................. 438/542; 438/565
(58) Field of Search .................................. 438/542, 557, 438/558, 565, 567, 478

(56) References Cited

U.S. PATENT DOCUMENTS

| | | | |
|---|---|---|---|
| Re. 31,473 | 12/1983 | Kilby et al. ............................ | 425/6 |
| 4,812,166 | * 3/1989 | Saiki et al. . | |
| 5,223,452 | * 6/1993 | Knepprath . | |
| 5,367,981 | * 11/1994 | Maruyama .......................... | 117/200 |
| 5,462,639 | 10/1995 | Matthews et al. ................ | 156/662.1 |
| 5,560,543 | 10/1996 | Smith et al. ...................... | 239/102.2 |
| 5,763,320 | * 6/1998 | Stevens ............................... | 438/563 |
| 5,926,727 | * 7/1999 | Stevens ............................... | 438/564 |
| 5,955,776 | 9/1999 | Ishikawa ............................. | 257/618 |
| 6,024,545 | * 2/2000 | Nakata ................................ | 257/459 |
| 6,120,602 | 9/2000 | Stephens et al. ................... | 117/200 |

FOREIGN PATENT DOCUMENTS 2-119241    10/1988    (JP) .

OTHER PUBLICATIONS

U.S. Application No. 09/032,965, filed Mar. 2, 1998, entitled: Plasma Immersion Ion Processor for Fabricating Semiconductor Integrated Circuits by Murzin, et al., copy of specification, abstract and figure No. one (Attorney Docket No. 22397.62).

U.S. Application No. 09/033,180, filed Mar. 2, 1998, entitled: Inductively Coupled Plasma Powder Vaporization for Fabricating Integrated Circuits by Murzin, et al., copy of specification, abstract and figure No. one (Attorney Docket No. 22397.61).

U.S. Application No. 09/351,202, filed Jul. 9, 1999, entitled: CVD Photo Resist Deposition by Ishikawa, et al., copy of specification, abstract and figure No. one (Attorney Docket No. 22397.92.02).

U.S. Application No. 09/346,249, filed Jul. 1, 1999, entitled: High Temperature Plasma–Assisted Diffusion by Zhang, et al., copy of specification, abstract and figure No. one (Attorney Docket No. 22397.74.02).

U.S. Application No. 09/113,671, filed Jul. 10, 1998, entitled: Method and Apparatus for Blanket Aluminum CVD on Spherical Integrated Circuits by Murzin, et al., copy of specification, abstract and figure No. one (Attorney Docket No. 22397.85).

* cited by examiner

Primary Examiner—Savitri Mulpuri
(74) Attorney, Agent, or Firm—Haynes and Boone LLP

(57) ABSTRACT

A method for doping crystals is disclosed. The method includes a receiver for receiving semiconductor spheres and a dopant. The semiconductor spheres are heated to a molten state. The dopant is absorbed by the semiconductor spheres. The semiconductor spheres are cooled to produce doped semiconductor spheres. The method is performed in a non-contact environment.

3 Claims, 2 Drawing Sheets

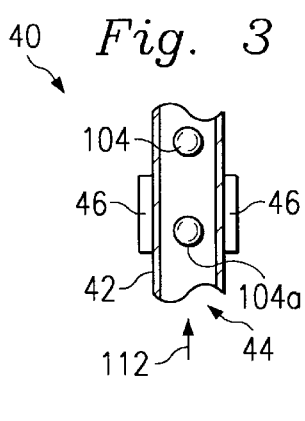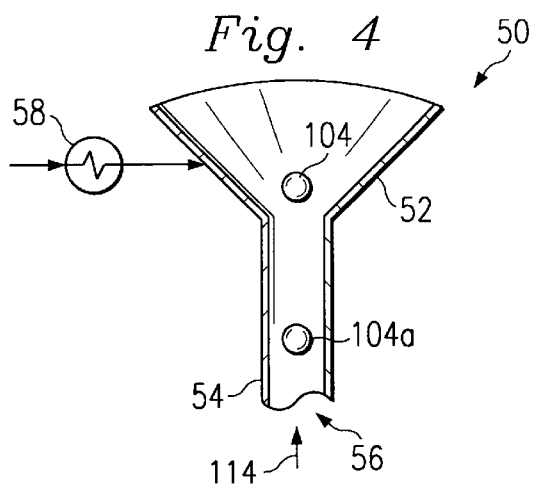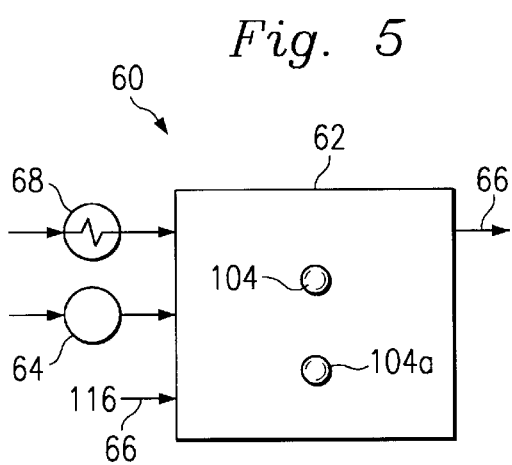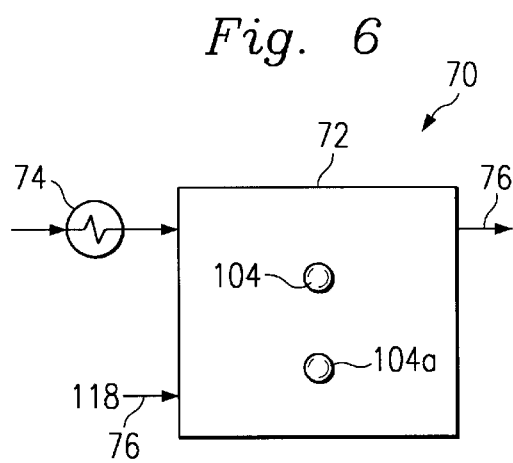

DOPING OF SPHERICAL SEMICONDUCTORS DURING NON-CONTACT PROCESSING IN THE LIQUID STATE

CROSS REFERENCE TO RELATED APPLICATIONS

This application is related to patent application Ser. No. 09/209,653, filed on Dec. 10, 1998, the disclosure of which is incorporated herein by reference.

BACKGROUND OF THE INVENTION

The invention relates generally to semiconductor devices, and more particularly, to a method for doping spherical-shaped semiconductors.

The doping process involves the controlled introduction of an impurity to a substrate, which produces subtle changes in the electrical resistivity of the substrate. Such characteristics are necessary for solid-state electronic semiconductor devices, such as a transistor or integrated circuit.

A current method to produce doped, spherical single crystal substrates involves doping the surface of a polycrystalline silicon granule, and then melting it to create a homogeneously doped crystal. Both the doping and the melting comprise two separate steps that are carried out in a furnace in sequence. A third step involves processing (i.e. partial melting/recrystallizing) the homogeneously doped crystal to produce a doped single crystal.

In U.S. Pat. Nos. 5,278,097, 5,955,776, and 5,223,452, methods and apparatuses for doping spherical-shaped semiconductors are disclosed. However, an improved method of doping the spherical shaped semiconductors, which is simpler and more economical, is desired.

SUMMARY OF THE INVENTION

The present invention, accordingly, provides a method for doping spherical semiconductors. To this end, one embodiment provides a chamber for levitating semiconductor spheres. The semiconductor spheres are then heated and melted within the chamber. A dopant is introduced into the chamber to diffuse into the molten semiconductor spheres.

In one embodiment, the method of doping a three dimensional substrate in a non-contact environment includes: receiving a three dimensional substrate; melting the three dimensional substrate to a liquid state; doping the three dimensional substrate with a dopant to create a doped three dimensional substrate; and recrystallizing the doped three dimensional substrate to create a doped three dimensional single crystal.

In one embodiment, the three dimensional substrate is a spherical shaped semiconductor.

In one embodiment, the non-contact environment can be achieved by floating or levitating the substrate, such as through aerodynamic levitation, acoustic levitation, electromagnetic levitation or a drop tube.

In one embodiment, melting the spherical shaped semiconductor to a liquid state includes placing the spherical shaped semiconductor in a chamber connected to a heat source. The heat source may be an Inductively Coupled Plasma (ICP) torch, which may also serve to maintain the non-contact environment. Other heat sources include an infrared lamp, a resistance furnace, an electromagnetic radiation heater, or a laser.

In one embodiment, doping the spherical shaped semiconductor includes diffusing the dopant through the spherical shaped semiconductor. The dopant may be a dopant plasma produced by passing a solid dopant mixed with an inert gas through an ICP torch or by lining an ICP torch with a solid dopant. The solid dopant may be boron nitride (BN), phosphorous (P), or antimony (Sb).

In one embodiment, the dopant is a dopant vapor produced by bubbling an inert gas through a dopant liquid, mixing a dopant gas with an inert gas, or passing an inert gas over a liquified solid dopant. The dopant liquid may be phosphorous oxychloride ($POCl_3$) or boron tribromide ($BBr_3$).

In one embodiment, the liquified solid dopant may be antimony (Sb), phosphorous (P), or gallium (Ga). The dopant gas may be phosphine ($PH_3$) or diborane ($B_2H_6$).

In one embodiment, the dopant is a dopant plasma comprised of passing the dopant vapor through an ICP torch.

In one embodiment, the dopant is a dopant vapor produced from lining the chamber with a solid dopant.

In one embodiment, the solid dopant is selected from the group consisting of boron nitride (BN), phosphorous (P), or antimony (Sb).

BRIEF DESCRIPTION OF THE DRAWINGS

FIG. 3 is a cross-sectional view of an alternate embodiment of an apparatus for use with the method of FIG. 2.

FIG. 4 is a cross-sectional view of an alternate embodiment of an apparatus for use with the method of FIG. 2.

FIG. 5 is a cross-sectional view of an alternate embodiment of an apparatus for use with the method of FIG. 2.

FIG. 6 is a cross-sectional view of an alternate embodiment of an apparatus for use with the method of FIG. 2.

DESCRIPTION OF THE PREFERRED EMBODIMENT

The present invention provides a method for doping substrates. The following description provides many different embodiments, or examples, for implementing different features of the invention. Certain techniques and components described in these different embodiments may be combined to form more embodiments. Also, specific examples of components, chemicals, and processes are described to help clarify the invention. These are, of course, merely examples and are not intended to limit the invention from that described in the claims.

Figure 1:
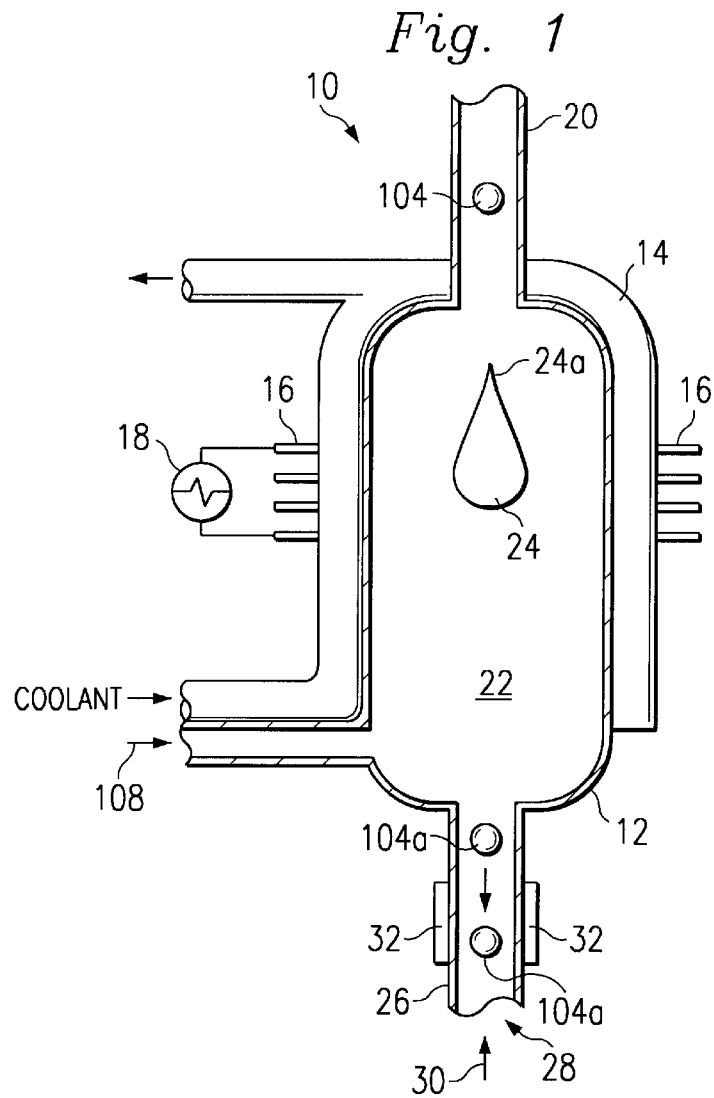
FIG. 1 is a cross-sectional view of an apparatus for use in doping spherical semiconductors according to one embodiment of the present invention.

Referring to FIG. 1, an embodiment of an apparatus for melting spherical semiconductors includes an inductively coupled plasma ("ICP") torch 10 positioned above a drop tube 26. The ICP torch 10 includes a quartz tube 12 made of a high temperature material, for example, ceramic. Surrounding the quartz tube 12 is a cooling system 14. The cooling system 14 may include water or any other type of coolant to help prevent the quartz tube 12 from melting.

Also, surrounding the quartz tube 12 is a conductive coil 16. In the present embodiment, the conductive coil 16 is a hollow copper coil attached to a radio frequency ("RF") energy generator 18. Because the conductive coil 16 is hollow, air or other fluid can flow there through to help lower the temperature of the coil.

An entry tube 20 is attached to the quartz tube 12 for receiving a plurality of spherical semiconductors 104 and directing them towards a central chamber 22 of the quartz tube. Although not shown, a shield may be provided to prevent radiation losses from plasma in the entry tube 20.

In operation, a plasma gas 108 flows at atmospheric pressure inside the quartz tube 12. The RF generator 18 operates at a desired frequency to heat the plasma gas 108, thereby creating a plasma flame 24. The plasma flame 24 is preferably at a temperature between 8000°K to 10,000°K, which depends on the gas flow rate and torch dimensions. A portion of the flame 24a extends into the entry tube 20 and serves as a preheater.

When the spherical semiconductors 104 enter the entry tube 20, they are quickly preheated by the plasma flame 24a. The spherical semiconductors 104 then enter the central chamber 22 and are melted by the plasma flame 24. Because the temperature of the flame 24 is so high, impurities in the spherical semiconductors 104 will vaporize. As the spherical semiconductors 104 exit the central chamber 22, they solidify to form crystals 104a. The crystals 104a advance through the drop tube 26 where they cool.

The drop tube 26 will allow the crystals 104a to cool and form a single crystal structure. The drop tube 26 includes an aperture 28 so that a cooling gas 30 may flow therein. In some embodiments, a heater 32 is placed adjacent to the drop tube 26. The heater 32 helps to reduce the number of different crystalline growth directions by slowing the cooling process. The cooling gases 30 may be, for example, helium, hydrogen, argon, or nitrogen to facilitate the cooling of the crystals 104a. The cooling gases 30 may also be used to control the rate of descent of the crystals 104a. The drop tube 26 may be stainless steel with an electro-polished inside finish, about five to ten centimeters in diameter and about ten meters in length.

Figure 2:
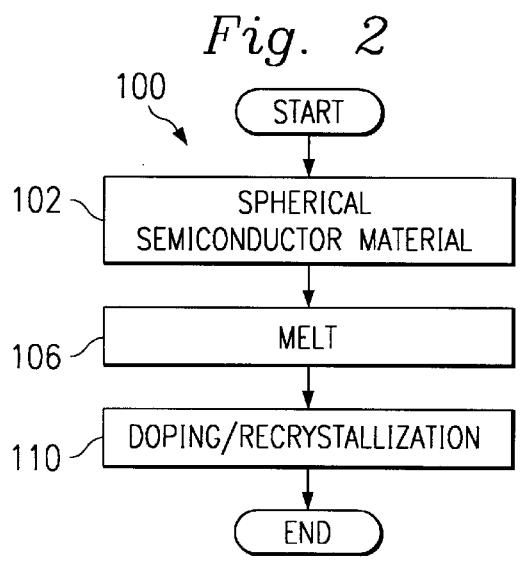
FIG. 2 is a flow chart of an embodiment of a method for doping a spherical shaped semiconductor using the apparatus of FIG. 1.

Referring to FIG. 2, a method 100 may be used in conjunction with the apparatus 10. At step 102, a plurality of spherical semiconductors 104 are received in the entry tube 20 of the ICP torch 10. The spherical semiconductors 104 may be, for example, any commercially available spherical semiconductor material. In a preferred embodiment, the spherical semiconductors 104 are silicon.

At step 106, a plasma gas 108 flows at atmospheric pressure inside the quartz tube 12. The RF generator 18 operates at a desired frequency to heat the plasma gas 108, thereby creating the plasma flame 24. The spherical semiconductors 104 enter the central chamber 22 where the plasma flame 24 melts them. The plasma gas 108 may be, for example, a mixture of a gas phase dopant and an inert gas. In a preferred embodiment, the plasma gas 108 is a mixture of phosphine ($PH_3$) and argon (Ar). In an alternate embodiment, the plasma gas 108 is a mixture of diborane ($B_2H_6$) and argon (Ar). The amount of gas phase dopant in the plasma gas 108 is chosen to maximize the amount of the gas phase dopant in the plasma gas 108. The plasma flame 24 includes ions of the plasma gas 108.

At step 110, the spherical semiconductors 104, now in the liquid state from the plasma flame 24, absorb the ions of the plasma gas 108 in the plasma flame 24. As the spherical semiconductors 104 exit the central chamber 12, they solidify to form crystals 104a. The crystals 104a include the dopant ions in the lattice of the crystals 104a. The crystals 104a are cooled in the drop tube 26.

In an alternate embodiment, the plasma gas 108 is argon gas. A solid liner sleeve of solid dopant material is inserted into the central chamber 22 such that the plasma flame 24 passes through the solid dopant material, and the argon gas carries the solid dopant material throughout the central chamber 22. The solid dopant material is ionized by the plasma flame 24 so that the plasma flame 24 contains a certain concentration of the dopant material. The solid dopant material may be, for example, boron nitride (BN), phosphorus (P), or antimony (Sb).

The plasma gas may be produced in many different ways. For one, the plasma gas 108 may be produced by mixing a very fine powder of the solid dopant material with argon gas. The solid dopant material would be vaporized and ionized in the plasma flame 24. Alternatively, the plasma gas 108 may be produced by passing argon (Ar) through liquid phosphorus oxychloride ($POCl_3$). The plasma gas 108 may be produced by passing argon (Ar) through liquid boron tribromide ($BBr_3$). The plasma gas 108 may be produced by heating solid antimony (Sb) to a liquid state in a separate chamber and passing argon over the liquid. The plasma gas 108 may be produced by heating solid phosphorus (P) to a liquid state in a separate chamber and passing argon over the liquid. The plasma gas 108 may be produced by heating solid gallium (Ga) to a liquid state in a separate chamber and passing argon over the liquid.

Referring to FIG. 3, the reference numeral 40 designates, in general, an embodiment of an apparatus for melting spherical semiconductors. The apparatus includes a drop tube 42. The drop tube 42 includes an aperture 44 so that a cooling gas 112 may flow therein. In some embodiments, a heater 46 is placed adjacent to the drop tube 42.

In operation, the heater 46 melts the spherical semiconductors 104. The heater 46 may be, for example, an infrared lamp, a resistance furnace, an electromagnetic radiation heater or a laser. As the spherical semiconductors 104 cool, they solidify to form crystals 104a. The cooling gases 112 may be, for example, helium, hydrogen, argon, or nitrogen to facilitate the cooling of the crystals 104a. The cooling gases 112 may also be used to control the rate of descent of the spherical semiconductors 104. The drop tube 42 may be stainless steel with an electro-polished inside finish, about five to ten centimeters in diameter and about ten meters in length.

Referring also to FIG. 2, the apparatus 40 may be used with the method 100. At step 102, the spherical semiconductors 104 are placed in the drop tube 42. At step 106, the heater 46 melts the spherical semiconductors 104 to the molten state. At step 110, the cooling gas 112 flows at atmospheric pressure through the aperture 44 and into the drop tube 42.

In a preferred embodiment, the cooling gas 112 may be a mixture of a gas phase dopant and an inert gas. The cooling gas 112 may be, for example, a mixture of phosphine ($PH_3$) and argon (Ar). The amount of gas phase dopant in the cooling gas 112 is chosen to maximize the amount of the gas phase dopant in the cooling gas 112. The molten spherical semiconductor 104 absorbs the dopant. As the spherical semiconductors 104 free fall through the drop tube 42, they solidify to form crystals 104a. The crystals 104a include the dopant in the lattice of the crystals 104a.

In some embodiments, the apparatus 40 controls the rate at which the crystals 104a cool. This may occur by many different methods. For example, the cooling gases 112 may be heated.

There are various embodiments of the cooling gas. The cooling gas 112 may be a mixture of diborane ($B_2H_6$) and argon (Ar). The cooling gas 112 may be produced by passing argon (Ar) through liquid phosphorus oxychloride ($POCl_3$).

The cooling gas 112 may be produced by passing argon (Ar) through liquid boron tribromide (BBr$_3$). The cooling gas 112 may be produced by heating solid antimony (Sb) to a liquid state in a separate chamber and passing argon over the liquid. The cooling gas 112 may be produced by heating solid phosphorus (P) to a liquid state in a separate chamber and passing argon over the liquid. The cooling gas 112 may be produced by heating solid gallium (Ga) to a liquid state in a separate chamber and passing argon over the liquid.

Referring to FIG. 4, the reference numeral 50 designates, in general, an embodiment of an aerodynamic chamber for melting spherical semiconductors. The apparatus includes a cone 52 and a drop tube 54. The drop tube 54 includes an aperture 56 so that a levitating gas 114 may flow therein. The levitating gas 114 levitates the spherical semiconductors 104. A heater 58 is connected to the cone 52.

In operation, the heater 58 melts the spherical semiconductors 104. The heater 58 may be, for example, an infrared lamp, a resistance furnace, an electromagnetic radiation heater, or a laser. As the spherical semiconductors 104 cool, they solidify to form crystals 104a. The levitating gas 114 may be, for example, helium, hydrogen, argon, or nitrogen to facilitate the cooling of the crystals 104a. The levitating gas 114 may also be used to control the rate of descent of the spherical semiconductors 104. The drop tube 54 may be stainless steel with an electro-polished inside finish, about five to ten centimeters in diameter and about ten meters in length. The cone 52 may be stainless steel with an electro-polished inside finish, about five to ten centimeters in diameter.

Referring also to FIG. 2, the apparatus 50 may be used with the method 100. At step 102, the spherical semiconductors 104 are placed in the cone 54. The levitating gas 114 flows through the aperture 56 to levitate the spherical semiconductors 104. At step 106, the heater 58 melts the spherical semiconductors 104 to the molten state. At step 110, the levitating gas 114 flows at atmospheric pressure through the aperture 56 and into the drop tube 54.

In a preferred embodiment, the levitating gas 114 may be a mixture of a gas phase dopant and an inert gas. The levitating gas 114 may be, for example, a mixture of phosphine (PH$_3$) and argon (Ar). The amount of gas phase dopant in the levitating gas 114 may be chosen to maximize the amount of the gas phase dopant in the levitating gas 114. The molten spherical semiconductor 104 absorbs the dopant. As the spherical semiconductors 104 free fall through the drop tube 54, they solidify to form crystals 104a. The crystals 104a include the dopant in the lattice of the crystals 104a.

In an alternate embodiment, the levitating gas 114 may be a mixture of diborane (B$_2$H$_6$) and argon (Ar). Alternatively, the levitating gas 114 may be produced by passing argon (Ar) through liquid phosphorus oxychloride (POCl$_3$). The levitating gas 114 may be produced by passing argon (Ar) through liquid boron tribromide (BBr$_3$). The levitating gas 114 may be produced by heating solid antimony (Sb) to a liquid state in a separate chamber and passing argon over the liquid. The levitating gas 114 may be produced by heating solid phosphorus (P) to a liquid state in a separate chamber and passing argon over the liquid. The levitating gas 114 may be produced by heating solid gallium (Ga) to a liquid state in a separate chamber and passing argon over the liquid.

In an alternate embodiment, the levitating gas 114 may be argon gas and the cone 52 may be lined with a solid dopant. As the cone 52 is heated by the heater 58, the vapor pressure of the solid dopant increases above the cone 52. The solid dopant vapor may be brought into contact with the semiconductor spheres 104 by the levitating gas 114. The solid dopant may be, for example, boron nitride (BN), phosphorous (P), or antimony (Sb). In a preferred embodiment, the solid dopant may be boron nitride (BN).

Referring to FIG. 5, the reference numeral 60 designates, in general, an embodiment of an acoustic chamber for melting spherical semiconductors. The apparatus includes a chamber 62 and a sound wave producing apparatus 64. The chamber 62 includes one or more apertures 66 so that a dopant gas 116 may flow therein. A heater 68 may be connected to the chamber 62.

In operation, the sound wave producing apparatus 64 levitates the spherical semiconductors 104 by sound waves. The sound wave producing apparatus 64 may be any commercially available apparatus that produces sound waves. The heater 68 melts the spherical semiconductors 104. The heater 68 may be, for example, an infrared lamp, a resistance furnace, an electromagnetic radiation heater, or a laser. As the spherical semiconductors 104 cool, they solidify to form crystals 104a. The dopant gas 116 may be, for example, helium, hydrogen, argon, or nitrogen to facilitate the cooling of the crystals 104a.

Referring also to FIG. 2, the apparatus 60 may be used with the method 100. At step 102, the spherical semiconductors 104 are placed in the chamber 62. The dopant gas 116 flows through the apertures 66. The sound wave producing apparatus 64 produces sound waves that levitate the spherical semiconductors 104. At step 106, the heater 68 melts the spherical semiconductors 104 to the molten state. At step 110, the dopant gas 116 flows at atmospheric pressure through the aperture 66 and into chamber 62.

In a preferred embodiment, the dopant gas 116 may be a mixture of a gas phase dopant and an inert gas. The dopant gas 116 may be, for example, a mixture of phosphine (PH$_3$) and argon (Ar). The amount of gas phase dopant in the dopant gas 116 may be chosen to maximize the amount of the gas phase dopant in the dopant gas 116 so that the molten spherical semiconductor 104 absorbs the dopant. As the spherical semiconductors 104 cool in the chamber 62, they solidify to form crystals 104a. The crystals 104a include the dopant in the lattice of the crystals 104a.

In an alternate embodiment, the dopant gas 116 may be a mixture of diborane (B$_2$H$_6$) and argon (Ar). The dopant gas 116 may be produced by passing argon (Ar) through liquid phosphorus oxychloride (POCl$_3$). Alternatively, the dopant gas 116 may be produced by passing argon (Ar) through liquid boron tribromide (BBr$_3$). The dopant gas 116 may be produced by heating solid antimony (Sb) to a liquid state in a separate chamber and passing argon over the liquid. The dopant gas 116 may be produced by heating solid phosphorus (P) to a liquid state in a separate chamber and passing argon over the liquid. The dopant gas 116 may be produced by heating solid gallium (Ga) to a liquid state in a separate chamber and passing argon over the liquid.

Referring to FIG. 6, the reference numeral 70 designates, in general, an embodiment of a chamber for the doping of spherical semiconductors. The apparatus includes a chamber 72 and an electromagnetic radiation apparatus 74. The chamber 72 includes one or more apertures 76 so that a dopant gas 118 may flow therein.

In operation, the electromagnetic radiation apparatus 74 levitates the spherical semiconductors 104 by electromagnetic radiation. The electromagnetic radiation apparatus 74 may be any commercially available apparatus that produces electromagnetic radiation. The electromagnetic radiation apparatus 74 also melts the spherical semiconductors 104. As the spherical semiconductors 104 cool, they solidify to form crystals 104a. The dopant gas 118 may be, for example, helium, hydrogen, argon, or nitrogen to facilitate the cooling of the crystals 104a.

Referring also to FIG. 2, the apparatus 70 may be used with the method 100. At step 102, the spherical semiconductors 104 are placed in the chamber 72. The dopant gas 118 flows through the apertures 76. The electromagnetic radiation apparatus 74 produces electromagnetic radiation that levitates the spherical semiconductors 104. At step 106, the electromagnetic radiation apparatus 74 melts the spherical semiconductors 104 to the molten state. At step 110, the dopant gas 118 flows at atmospheric pressure through the aperture 76 and into chamber 72.

In a preferred embodiment, the dopant gas 118 may be a mixture of a gas phase dopant and an inert gas. The dopant gas 118 may be, for example, a mixture of phosphine ($PH_3$) and argon (Ar). The amount of gas phase dopant in the dopant gas 118 may be chosen to maximize the amount of the gas phase dopant in the dopant gas 118. The molten spherical semiconductor 104 absorbs the dopant. As the spherical semiconductors 104 cool in the chamber 72, they solidify to form crystals 104a. The crystals 104a include the dopant the lattice of the crystals 104a. The dopant gas 118 may be a mixture of diborane ($B_2H_6$) and argon (Ar). The dopant gas 118 may be produced by passing argon (Ar) through liquid phosphorus oxychloride ($POCl_3$). The dopant gas 118 may be produced by passing argon (Ar) through liquid boron tribromide ($BBr_3$). The dopant gas 118 may be produced by heating solid antimony (Sb) to a liquid state in a separate chamber and passing argon over the liquid. The dopant gas 118 may be produced by heating solid phosphorus (P) to a liquid state in a separate chamber and passing argon over the liquid. The dopant gas 118 may be produced by heating solid gallium (Ga) to a liquid state in a separate chamber and passing argon over the liquid.

Several advantages result from the above-described embodiments. For one, the material seldom, if ever, comes in physical contact with any other device or any part of the apparatuses 10, 40, 50, 60, or 70. By melting the material without physical contact, less contaminants are introduced. Also, as the material drops or is levitated, it becomes spherical due to surface tension. Furthermore, single crystals can be formed either through controlled melting and cooling of the material, or by injecting a single crystal seed into the material. Further still, many crystals can be processed in rapid succession.

It is understood that several variations may be made in the foregoing. Other modifications, changes and substitutions are also intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method of doping a three dimensional substrate in a non-contact environment, the method comprising the sequential steps of:

receiving a three dimensional substrate;

melting the three dimensional substrate to a liquid state;

doping the three dimensional substrate with a dopant to create a doped three dimensional substrate;

recrystallizing the doped three dimensional substrate to create a doped three dimensional single crystal;
   wherein the three dimensional single crystal is a spherical shaped semiconductor; and
   wherein the dopant is a dopant plasma produced by either passing a solid dopant mixed with an inert gas through an Inductively Coupled Plasma (ICP) torch or by lining an ICP torch with a solid dopant.

2. The method of claim 1, wherein the solid dopant is selected from the group consisting of boron nitride (BN), phosphorous (P), and antimony (Sb).

3. A method of doping a three dimensional substrate in a non-contact environment, the method comprising the sequential steps of:

receiving a three dimensional substrate;

melting the three dimensional substrate to a liquid state;

doping the three dimensional substrate with a gaseous dopant to create a doped three dimensional substrate;

recrystallizing the doped three dimensional substrate to create a doped three dimensional single crystal; and
   wherein the three dimensional single crystal is a spherical shaped semiconductor; and
   wherein the non-contact environment is achieved by an Inductively Coupled Plasma (ICP) torch.

* * * * *